United States Patent [19]

Cha

[11] Patent Number: 5,930,179
[45] Date of Patent: Jul. 27, 1999

[54] PROGRAM CIRCUIT

[75] Inventor: Byoung Kwon Cha, Ichon-Shi, Rep. of Korea

[73] Assignee: Hyundai Electronics Industries, Co., Ltd., Kyungki, Rep. of Korea

[21] Appl. No.: 08/882,835

[22] Filed: Jun. 26, 1997

[30] Foreign Application Priority Data

Jun. 29, 1996 [KR] Rep. of Korea ...................... 96-25547

[51] Int. Cl.⁶ .................................................. G11C 7/00
[52] U.S. Cl. ................... 365/189.07; 365/185.22
[58] Field of Search .............................. 365/189.07, 201, 365/185.22

[56] References Cited

U.S. PATENT DOCUMENTS

| | | | |
|---|---|---|---|
| 4,811,294 | 3/1989 | Kobayashi et al. | 365/189.07 |
| 5,299,162 | 3/1994 | Kim et al. | 365/201 |
| 5,629,890 | 5/1997 | Engh | 365/189.07 |

*Primary Examiner*—Tan T. Nguyen
*Attorney, Agent, or Firm*—Scott C. Harris, Esq.

[57] ABSTRACT

The program circuit according to the present invention can apply a program voltage to the only memory cells which are not programmed during a re-programming operation, thus, the present invention can be prevent a lowering of reliability of the memory cell due to a continued supply of a program bias voltage.

4 Claims, 1 Drawing Sheet

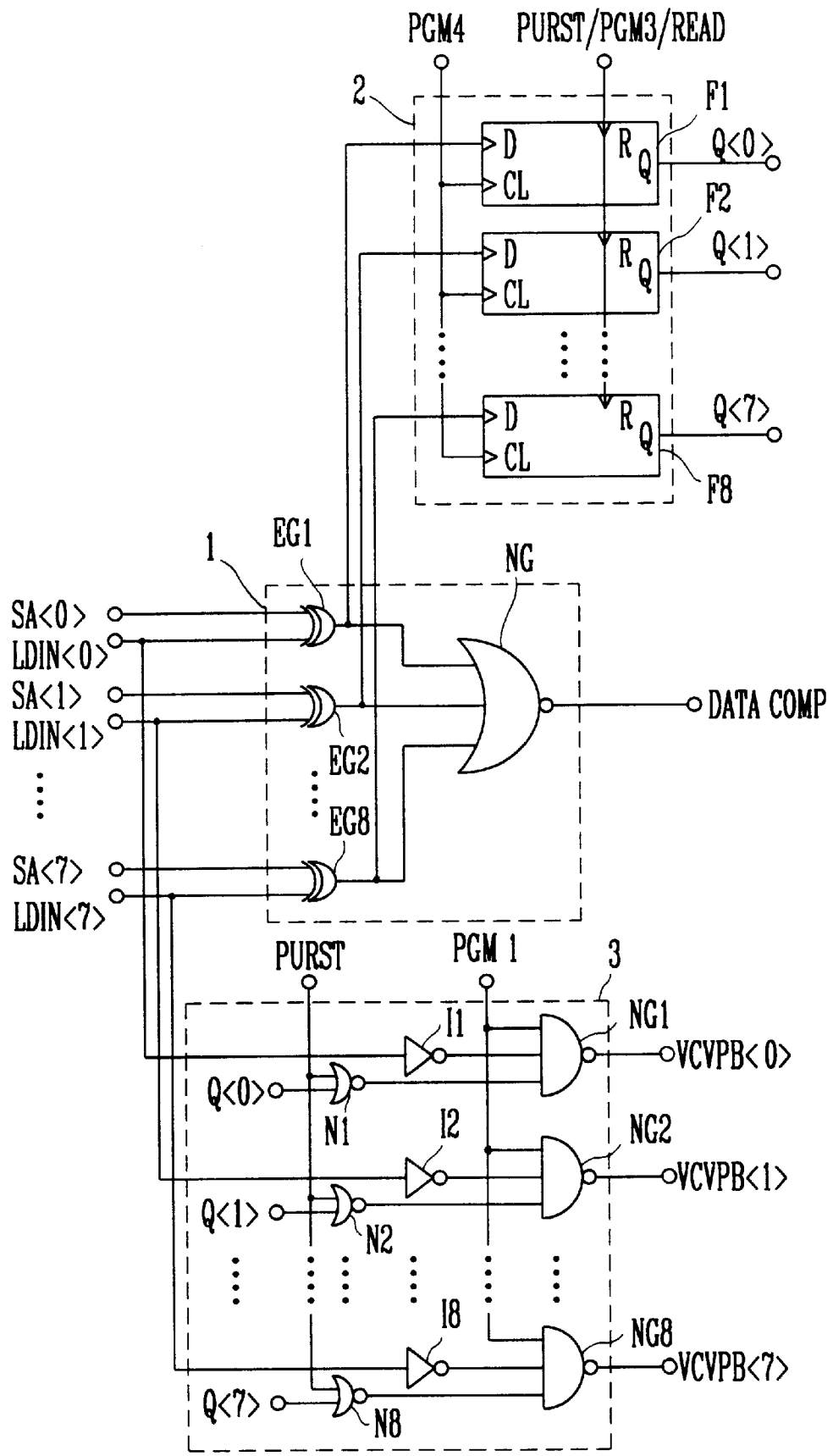

PROGRAM CIRCUIT

BACKGROUND OF THE INVENTION

1. Field of the Invention

The present invention relates to a program circuit and, more particularly, to a program circuit which can prevent a lowering of reliability occurring during the process of verifying the programmed data.

2. Description of the Prior Arts

Generally, a flash memory device has functions of electrical program and erasure. The flash memory device also performs a verification operation so as to confirm whether the memory cell has been programmed or erased or not after completion of the programming or the erasure operation. At this time, if there are memory cells in which a programming or erasure operation has not completed, re-programming or re-erasure operation is performed again.

In a conventional flash memory device, however, a program bias voltage is applied to a memory cell which is already programmed during a re-programming operation, thus the already programmed memory cell is damaged. This is because the program bias voltage of high voltage is applied to the memory cell, therefore, charge is trapped at the tunnel oxide film of the memory. As a result, reliability of the memory cell is degraded.

SUMMARY OF THE INVENTION

It is therefore an object of the present invention to provide a program circuit which can apply a program bias voltage only to the memory cell which is not programmed during a re-programming operation.

To achieve the object described above, a program circuit according to the present invention comprises a comparator for comparing output data of a data input buffer with output data of a sense amplifier bit by bit and for outputting a re-program operation signal if the data are different each other, a data latch circuit for latching the comparing results of the output data of the data input buffer and the output data of the sense amplifier, and a control circuit for generating a high voltage for receiving the output data of the data input buffer and the data latched at the data latch circuit, respectively and for outputting a signal for applying a program bias voltage to a memory cell which has not been programmed in response to a power-up reset signal and program state signal.

The comparator includes a plurality of exclusive gates to which output data of the data input buffer and output data of the sense amplifier, respectively, and a NOR gate for logically combining the output signals of the exclusive NOR gates.

The data latch circuit has a plurality of flip-flops, each flip-flop has a data input terminal to which comparing results of the output data of the data input buffer and the output data of the sense amplifier, a clock signal input terminal to which a program state signal, and a reset signal input signal to which power-up reset signal/program state signal/read mode signals are inputted.

The control circuit for generating a high voltage includes a plurality of NOR gates to which output data of the data latch circuit and a power-up reset signal are inputted, respectively, a plurality of inverters to which output data of the data input buffer is inputted; and a plurality of NAND gates to which the output signals of the NOR gates, the output signals of the inverters and the program state signal are inputted, respectively.

BRIEF DESCRIPTION OF THE DRAWING

Other objects and advantages of the present invention will be understood by reading the detailed explanation of the embodiment with reference to the accompanying drawing in which:

FIGURE is a circuit diagram for explaining a program circuit according to the present invention.

DESCRIPTION OF THE INVENTION

The accompanying drawing is a circuit diagram for explaining a program circuit according to the present invention.

The program circuit according to the present invention is consisted of a comparator 1, a data latch circuit 2, and a control circuit for generating a high voltage 3, and added to the flash memory device.

The comparator 1 comprises of a plurality of exclusive NOR gates EG1 through EG8 to which output data LDIN0 through LDIN7 of a data input buffer and output data SA0 through SA7 of a sense amplifier are inputted, respectively. Also, the comparator 1 comprises a NOR gate NG to which output signals of the exclusive NOR gates EG1 through EG8 are inputted. The NOR gate NG outputs logical combination signals via an output terminal DATA COMP.

The data latch circuit 2 is consisted of a plurality of flip-flops F1 through F8. Each of flip-flops F1 through F8 comprises a data input terminal D to which an output signal of one of the exclusive NOR gates EG1 through EG8, a clock signal input terminal CL to which a program state signal PGM4 is inputted, and a reset signal input terminal R to which a power-up reset signal/program state signal/read mode signals PURST/PGM3/READ are inputted.

The control circuit for generating a high voltage 3 comprises a plurality of NOR gates N1 through N8 to which output data Q0 through Q7 of the flip-flops F1 through F8 and the power-up reset signal PURST are inputted, respectively, a plurality of inverters I1 through I8 to which the output data LDIN0 through LDIN7 of data input buffer are inputted, respectively, and a plurality of NAND gates NG1 through NG8 to which output signals of the NOR gates N1 through N8, output signals of the inverters I1 through I8 and the program state signal PGM1, respectively. The plurality of NAND gates NG1 through NG2 output signals VCVPB0 through VCVPB7, respectively.

An operation of the program circuit will be now explained below.

For example, in case where a verification operation is performed after data "10011000" of 8 bits inputted through the data input buffer was programmed into the memory cell, the data "10011000" is inputted to the exclusive NOR gates EG1 through EG8 via one input terminal, respectively, and the data read from the memory cell, that is, the data SA0 through SA7 outputted from the sense amplifier are inputted to the exclusive NOR gates EG1 through EG8 via other input terminal, respectively.

At this time, assume that the data SA0 through SA7 outputted from the sense amplifier is "11011100". Then, since data SA1 and SA5 which are the second bit and the sixth bit, respectively, are different each other, the data outputted via the output terminals of the exclusive NOR gates EG1 through EG8 become "10011000". As a result, the output of the NOR gate NG is maintained at a low level, and a re-programming operation is performed. At the same time, the data "101111011" outputted via the output terminals of the exclusive NOR gates EG1 through EG8 is latched to the flip-flops F1 through F8 respectively depending on the input of the program state signal PGM4, and the output signals Q0 through Q7 of the flip-flops F1 through F8 are inputted to the NOR gates N1 through N8, respectively. For reference only, before the data "101111011" is inputted to the data latch circuit 2, the flip-flops F1 through F8 are maintained at the state in which the data of "0" is latched by the input of the power-up reset signal PURST. Thereafter, the data "10011000" outputted from the flip-flops F1 through F8 are inputted to the NOR gates N1 through N8 of the control circuit for generating high voltage 3 respectively, and the output data "1001100" of the data input buffer is inputted to the inverters I1 and I8, respectively.

At this time, signals at a low level are outputted from only the output terminals VCVPB1 and VCVPB5 of the NAND gates NG2 and NG6 by the power-up reset signal PURST inputted with a low level and the program state signal PGM1 inputted with a high level. Therefore, a programming bias voltage is again applied to only the memory cells which are corresponded to the second and the sixth bits, respectively.

As mentioned above, the program circuit according to the present invention can apply a program voltage to only the memory cells which are not programmed during a re-programming operation. Therefore, the present invention can be prevent a lowering of reliability of the memory cell due to a continued supply of a program bias voltage.

The foregoing description, although described in its preferred embodiments with a certain degree of particularity, is only illustrative of the principle of the present invention. It is to be understood that the present invention is not to be limited to the preferred embodiment disclosed and illustrated herein. Accordingly, all expedient variations that may be made within the scope and spirit of the present invention are to be encompassed as further embodiments of the present invention.

What is claimed is:

1. A program circuit comprising:

a comparator for comparing output data of a data input buffer with output data of a sense amplifier bit by bit, and for outputting a re-program operation signal if the data are different from each other;

a data latch circuit for latching the comparing results of the output data of said data input buffer and the output data of said sense amplifier;

a control circuit for generating a high voltage for receiving the output data of said data input buffer and the data latched at said data latch circuit, respectively, and for outputting a signal for applying a program bias voltage to a memory cell which has not been completely programmed in response to a power-up reset signal and program state signal.

2. The program circuit as claimed in claim 1, wherein said comparator includes a plurality of exclusive-NOR gates to which output data of said data input buffer and output data of said sense amplifier, respectively, and a NOR gate for logically combining the output signals of said exclusive-NOR gates.

3. The program circuit as claimed in claim 1, wherein said data latch circuit includes a plurality of flip-flops, each flip-flop having a data input terminal to which comparing results of the output data of said data input buffer and the output data of said sense amplifier, a clock signal input terminal to which a program state signal and a reset signal input signal to which power-up reset signal/program state signal/read mode signals are inputted.

4. The program circuit as claimed in claim 1, wherein said control circuit for generating a high voltage includes a plurality of NOR gates to which output data of said data latch circuit and a power-up reset signal are inputted, respectively; a plurality of inverters to which output data of said data input buffer is inputted; and a plurality of NAND gates to which the output signals of said NOR gates, the output signals of said inverters and the program state signal are inputted, respectively.

* * * * *